(12) United States Patent
Miyanishi et al.

(10) Patent No.: US 10,163,739 B2
(45) Date of Patent: Dec. 25, 2018

(54) SOLID-STATE IMAGING DEVICE AND METHOD FOR PRODUCING THE SAME

(71) Applicants: Isamu Miyanishi, Osaka (JP); Tohru Kanno, Osaka (JP)

(72) Inventors: Isamu Miyanishi, Osaka (JP); Tohru Kanno, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/407,612

(22) Filed: Jan. 17, 2017

(65) Prior Publication Data

US 2017/0263513 A1 Sep. 14, 2017

(30) Foreign Application Priority Data

Mar. 14, 2016 (JP) .................................. 2016-050152

(51) Int. Cl.
*H01L 27/146* (2006.01)
*H01L 21/66* (2006.01)

(52) U.S. Cl.
CPC ........ *H01L 22/32* (2013.01); *H01L 27/14621* (2013.01); *H01L 27/14632* (2013.01); *H01L 27/14636* (2013.01); *H01L 27/14645* (2013.01); *H01L 27/14685* (2013.01); *H01L 27/14687* (2013.01)

(58) Field of Classification Search
CPC ......... H01L 27/14631; H01L 27/14632; H01L 27/14636; H01L 27/14645; H01L 27/14685; H01L 27/14687; H01L 22/32
See application file for complete search history.

(56) References Cited

U.S. PATENT DOCUMENTS

| 5,883,000 A * | 3/1999 | Pasch ................ H01L 21/32155 257/E21.316 |
| 8,957,720 B2 | 2/2015 | Miyanishi et al. |
| 2007/0109439 A1* | 5/2007 | Minamio .......... H01L 27/14627 348/340 |

(Continued)

FOREIGN PATENT DOCUMENTS

| JP | 2011-109352 | 6/2011 |
| JP | 2011-171328 | 9/2011 |

(Continued)

*Primary Examiner* — Matthew Reames
(74) *Attorney, Agent, or Firm* — Oblon, McClelland, Maier & Neustadt, L.L.P.

(57) ABSTRACT

A solid-state imaging device includes a substrate having a rectangular shape; a first region configured to extend on the substrate in a length direction of the substrate, and to include a plurality of electrode pads arranged above the substrate through a multilayer interconnection; and a second region configured to extend in the length direction, and to include an imaging element, an optical filter, and an insulating film. The second region extends on the substrate on which the imaging element is arranged. The optical filter is arranged above the substrate and faces the imaging element through the insulating film. The second region extends in parallel to the first region to be apart from the first region by a given distance. The plurality of electrode pads are arranged to be apart from each other by a given space, equal to or smaller than the given distance, in the length direction.

19 Claims, 13 Drawing Sheets

(56) References Cited

U.S. PATENT DOCUMENTS

| | | | |
|---|---|---|---|
| 2007/0190747 A1* | 8/2007 | Humpston | B81C 1/00285 |
| | | | 438/460 |
| 2010/0320554 A1* | 12/2010 | Toumiya | H01L 27/14627 |
| | | | 257/432 |
| 2013/0037902 A1* | 2/2013 | Nakazawa | H01L 27/14627 |
| | | | 257/432 |
| 2014/0070348 A1* | 3/2014 | Yee | H01L 27/14618 |
| | | | 257/432 |
| 2015/0018619 A1* | 1/2015 | Adler | H01L 27/14636 |
| | | | 600/112 |
| 2015/0200187 A1* | 7/2015 | Park | H01L 24/32 |
| | | | 257/777 |
| 2015/0333039 A1* | 11/2015 | Liu | H01L 23/5221 |
| | | | 257/773 |
| 2016/0088249 A1* | 3/2016 | Funaki | H04N 5/378 |
| | | | 348/296 |

FOREIGN PATENT DOCUMENTS

| | | |
|---|---|---|
| JP | 2012-195681 | 10/2012 |
| JP | 2015-106908 | 6/2015 |

\* cited by examiner

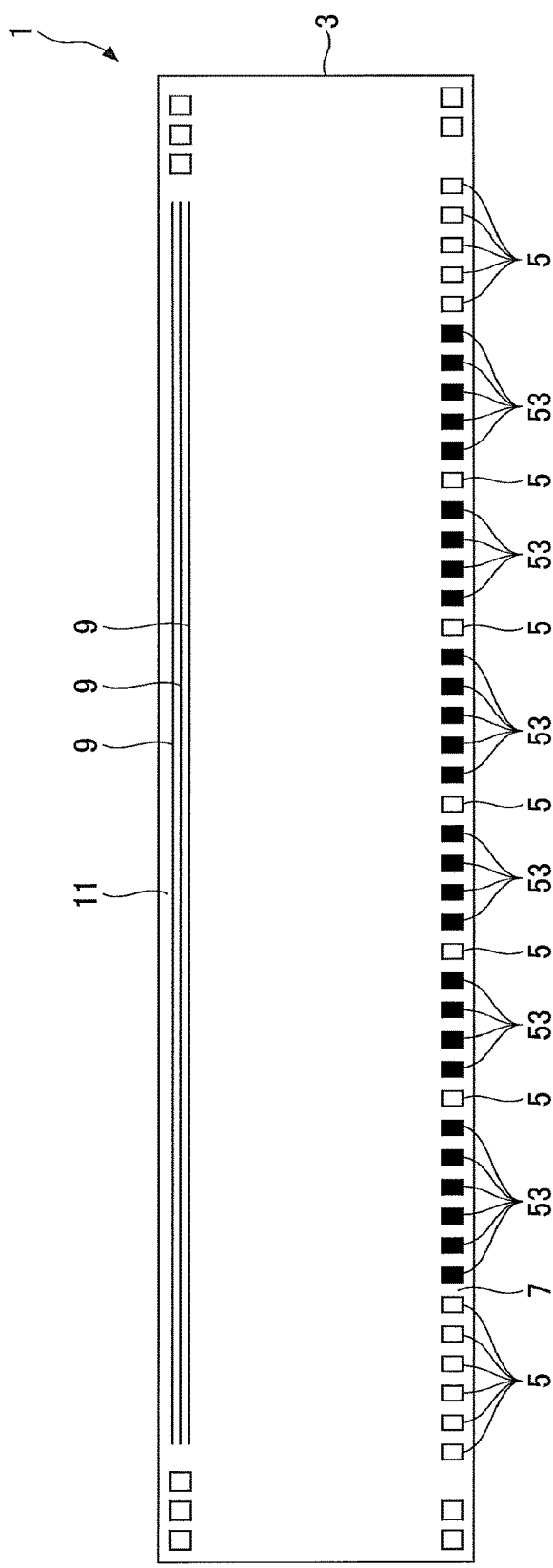

SOLID-STATE IMAGING DEVICE AND METHOD FOR PRODUCING THE SAME

CROSS-REFERENCE TO RELATED APPLICATIONS

The present application claims the benefit of priority under 35 U.S.C. § 119 of Japanese Patent Application No. 2016-050152 filed on Mar. 14, 2016, the entire contents of which are incorporated herein by reference.

BACKGROUND OF THE INVENTION

1. Field of the Invention

The disclosures herein generally relate to imaging devices and solid-state imaging devices.

2. Description of the Related Art

Solid-state imaging devices such as image sensors are broadly categorized into CCD and CMOS according to the type of imaging element. With respect to the arrangement of the imaging elements, the solid-state imaging devices are broadly categorized into area sensors and linear sensors. In an area sensor, imaging elements are arranged in a two-dimensional matrix. In a linear sensor, imaging elements are linearly arranged. In such solid-state imaging devices, various optical filters are used for enhancing the imaging functions.

The solid-state imaging devices are used for imaging monochrome or color images. In particular, a solid-state imaging device for color images is provided with a color filter serving as an optical filter, which allows transmission of light with specific wavelengths. The color filter is arranged on an optical path from an imaged object to the imaging element that receives the light. The provision of such a color filter makes color information of the imaged object available.

In a case where the color filter is arranged in the solid-state imaging device, primary color (i.e., RGB) filters or complementary color (i.e., CMYG) filters are provided above imaging elements provided on a semiconductor substrate. The color filters are provided by applying a light-sensitive resin containing a pigment or a dye above the imaging element in a producing process of the solid-state imaging device.

Uniformity is desired for optical filters such as color filters. For this purpose, when a material resin such as a light-sensitive resin is applied, a film forming method named a spin coating method is used as in the case where an interlayer insulating film or a photoresist used for patterning is formed.

SUMMARY OF THE INVENTION

In one embodiment, a solid-state imaging device includes a substrate having a rectangular shape; a first region configured to extend on the substrate in a length direction of the substrate, and to include a plurality of electrode pads arranged above the substrate through a multilayer interconnection; and a second region configured to extend in the length direction, and to include an imaging element, an optical filter, and an insulating film. The second region extends on the substrate on which the imaging element is arranged. The optical filter is arranged above the substrate and faces the imaging element through the insulating film. The second region extends in parallel to the first region to be apart from the first region by a given distance. The plurality of electrode pads are arranged to be apart from each other by a given space in the length direction. The given space is equal to or smaller than the given distance.

BRIEF DESCRIPTION OF THE DRAWINGS

FIG. 9 is a view of one example of the solid-state imaging device in one or more embodiments;

DESCRIPTION OF THE PREFERRED EMBODIMENTS

Figure 1:
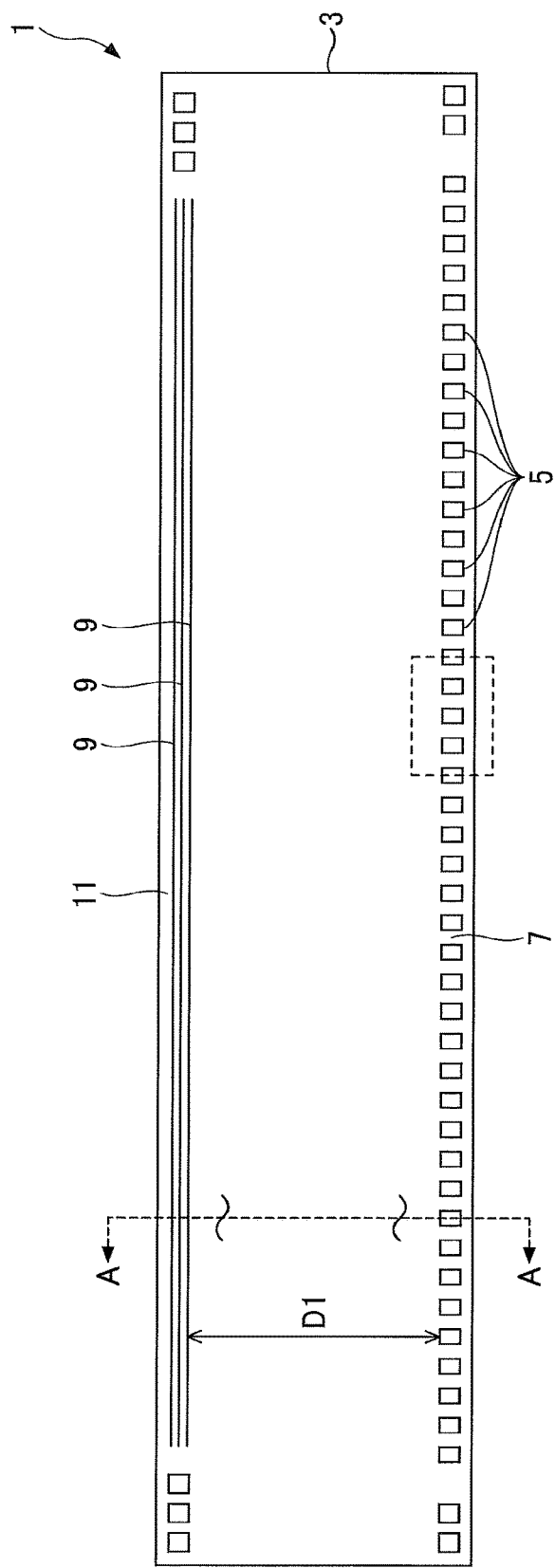
FIG. 1 is a view of one example of a solid-state imaging device in one or more embodiments.
Figure 2:
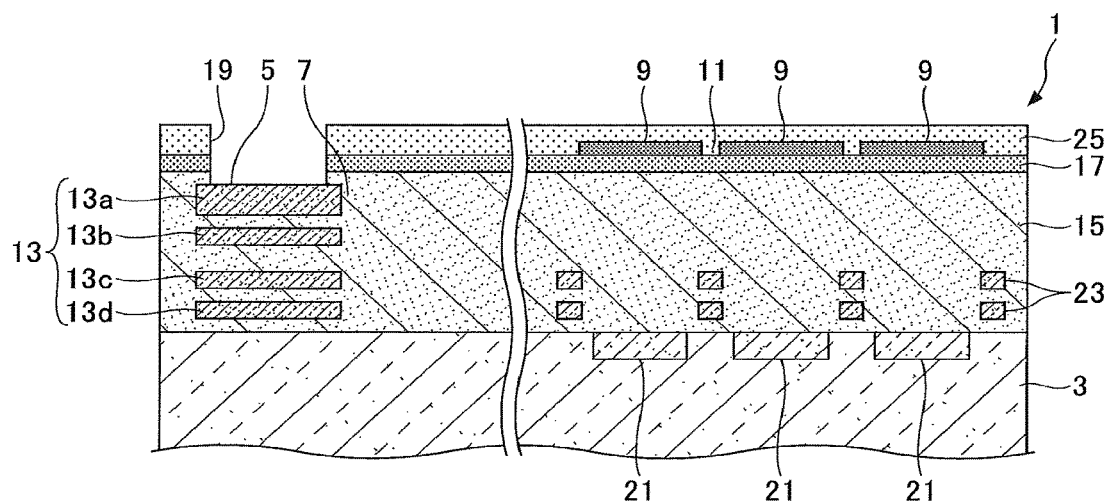
FIG. 2 is a cross-sectional view taken along the line A-A of FIG. 1.
Figure 3:
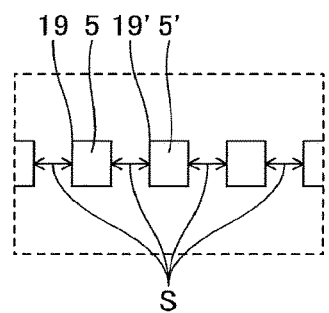
FIG. 3 is an enlarged view of a part surrounded by dashed lines of FIG. 1.

In the following, embodiments of the present invention will be described with reference to the accompanying drawings. Note that for each of the drawings, components that are identical or corresponding components to those previously defined are referred to by the same numerals; accordingly, their descriptions are omitted. FIG. 1 is a plan view of a linear sensor as one example of a solid-state imaging device in one or more embodiments. FIG. 2 is a cross-sectional view taken along the line A-A of FIG. 1, in which part of the solid-state imaging device is omitted. FIG. 3 is an enlarged view of a portion surrounded by dashed lines of FIG. 1.

A linear sensor 1 of FIG. 1 includes a substrate 3, a region 7, and a region 11. The region 7 and the region 11 are provided on the substrate 3. A plurality of electrode pads 5 are arranged in the region 7. Color filters 9 are arranged in the region 11. The substrate 3 may be a rectangular semiconductor. The substrate 3 is a non-limiting example of a substrate. The electrode pad 5 is a non-limiting example of an electrode pad. The region 7 is a non-limiting example of a first region. The color filter 9 is a non-limiting example of an optical filter. The region 11 is a non-limiting example of a second region.

The region 7 extends in a length direction of the substrate 3 with the plurality of electrode pads 5 being arranged in the region 7. The region 11 extends in the length direction of the substrate 3 with the color filters 9 being arranged in the region 11. Herein, the length direction means the direction in which the long side of the substrate 3 having a rectangular shape extends. The region 11 extends in parallel to the region 7, and is apart from the region 7 by a distance D1.

As illustrated in FIG. 2, the plurality of electrode pads 5 are arranged above the substrate 3 through a multilayer interconnection 13. An insulating film 15 including $SiO_2$ is arranged on the surface of the substrate 3.

The multilayer interconnection 13 includes interconnection layers 13a, 13b, 13c, and 13d that are stacked in the insulating film 15. The interconnection layers 13a to 13d are coupled by vias, not illustrated, between the interconnection layers 13a to 13d. The interconnection layers 13a to 13d are insulated by the insulating film 15. The multilayer interconnection 13 including the interconnection layers 13a, 13b, 13c, and 13d is used for coupling transistors and coupling the linear sensor 1 to the outside.

In the interconnection layers 13a to 13d included in the multilayer interconnection 13, the surface of the interconnection layer 13a located on the top of the interconnection layers 13a to 13d may serve as the electrode pad 5. The electrode pads 5 function as interfaces with signal lines or power sources, when the linear sensor 1 is packaged or when the linear sensor 1 is mounted as a bare chip. The electrode pads 5 are generally coupled by wires including Au or Cu. In the vicinities of the electrode pads 5, transistors in which impurities such as B or P are doped are provided on or above the semiconductor substrate.

A protective film 17 is arranged on the surface of the insulating film 15. The protective film 17 protects the multilayer interconnection 13 and the transistors arranged in the vicinities of the insulating film 15. The protective film 17 includes a SiN film that is deposited in a CVD method on the surface of the insulating film 15. The protective film 17 is provided to avoid interconnection corrosion caused by moisture and to avoid adverse effects on the transistors, in consideration of changes over time after the multilayer interconnection 13 is arranged.

On the surface side of the electrode pad 5, an opening 19 is arranged to expose a part of the surface of the interconnection layer 13a. That is to say, the electrode pad 5 corresponds to a part of the surface of the interconnection layer 13a exposed by the opening 19. The protective film 17 is applied on the whole wafer surface, and covers the electrode pads 5. Then, photoresist is applied, exposed, developed, and etched, so as to provide the opening 19 on the surface of the interconnection layer 13a (i.e., for electrode pad 5).

Photodiodes 21 are arranged on the surface of the substrate 3 (i.e., on the bottom side of the insulating film 15). It should be noted that the photodiode 21 is a non-limiting example of an imaging element in one or more embodiments. In the vicinities of the photodiodes 21, signal lines 23 are arranged to output electrical signals from the photodiodes 21. The color filters 9 are arranged above the substrate 3 in the region 11. The color filters 9 respectively face the photodiodes 21 arranged on the substrate 3 through the insulating film 15.

The color filters 9 are provided on the protective film 17. The protective film 17 is provided on the insulating film 15. The insulating film 15 is provided on the surface of the substrate 3. The color filters 9 are provided by applying a light-sensitive resin in a spin coating method. With the color filters 9 being provided, a planarization coat 25 is arranged on the surface of the protective film 17 to cover the color filters 9.

Examples of the color filter 9 may include, but are not limited to, a primary color filter or a complementary color filter. The primary colors are three primary colors of Red, Green, and Blue (RGB). The complementary colors are Cyan, Magenta, Yellow, and Green (CMYG). As illustrated in FIG. 2, the color filters 9 are provided to correspond to the photodiodes 21 on a one-to-one basis. This configuration enables the solid-state imaging device to read the color images.

As illustrated in FIG. 1, the region 11 is arranged above the substrate 3, extends in parallel to the region 7, and is apart from the region 7 by the distance D1. To be specific, the region 7 is arranged at a first end portion in a width direction perpendicular to the length direction of the substrate 3. The region 11 is arranged at a second end portion. The second end portion is the opposite side of the region 7 in the width direction of the substrate 3. In other words, the distance D1 indicates a distance between the region 7 and the region 11 in the width direction of the substrate 3. It is to be noted that the distance D1 corresponds to a given distance in one or more embodiments.

As illustrated in FIG. 3, the plurality of electrode pads 5 are arranged in the region 7 of the substrate 3. The plurality of electrode pads 5 are apart from each other by a space S in the length direction of the substrate 3. The space S indicates a distance between adjacent electrode pads 5 and 5'. That is to say, the space S corresponds to a distance between adjacent openings 19 and 19'. It is to be noted that the space S is one example of a given space in one or more embodiments.

The space S is equal to or smaller than the distance D1. In other words, the space S between the adjacent electrode pads 5 and 5' is equal to or smaller than the distance D1 between the region 7 and the region 11.

The space S is configured to be equal to or smaller than the distance D1. This configuration prevents unevenness that locally occurs on the optical filter 9, in which the unevenness is caused by a stepped portion generated at the opening 19 of the electrode pad 5, when the light-sensitive resin is applied to form an optical filter 9 such as a color filter. Therefore, the optical filters 9 having substantially even surfaces facing the imaging elements on a one-to-one basis are produced. This configuration eliminates or reduces degradation in imaging properties of the solid-state imaging device.

Next, one example of a producing method of a solid-state imaging device in one or more embodiments will be described. In one or more embodiments, the linear sensor 1 is produced in one example of the producing method. In the linear sensor 1, the photodiodes 21 are arranged on the rectangular substrate 3. The color filters 9 and electrode pads 5 coupled with the multilayer interconnection 13 are arranged above the rectangular substrate 3. In the producing method, a first process and a second process are included in one or more embodiments.

First, in the first process, the plurality of electrode pads 5 are arranged through the multilayer interconnection 13 at the first end portion in the width direction of the substrate 3, so as to form the region 7 that extends in the length direction of the substrate 3. Here, the plurality of electrode pads 5 are apart from each other by the space S in the length direction of the substrate 3.

Next, in the second process, the photodiodes 21 are provided at the second end portion in the width direction of the substrate 3. The color filters 9 are arranged to respectively face the photodiodes 21 through the insulating film 15 in the region 11 that extends in the length direction of the substrate 3. Here, the region 11 is arranged in parallel to the region 7, and is apart from the region 7 by the distance D1.

At this timing, the electrode pads 5 and the color filters 9 are respectively arranged in the region 7 and the region 11 above the substrate 3 so that the space S and the distance D1 satisfy S<=D1. In this manner, the solid-state imaging device as illustrated in FIG. 1 is produced.

Figure 4:
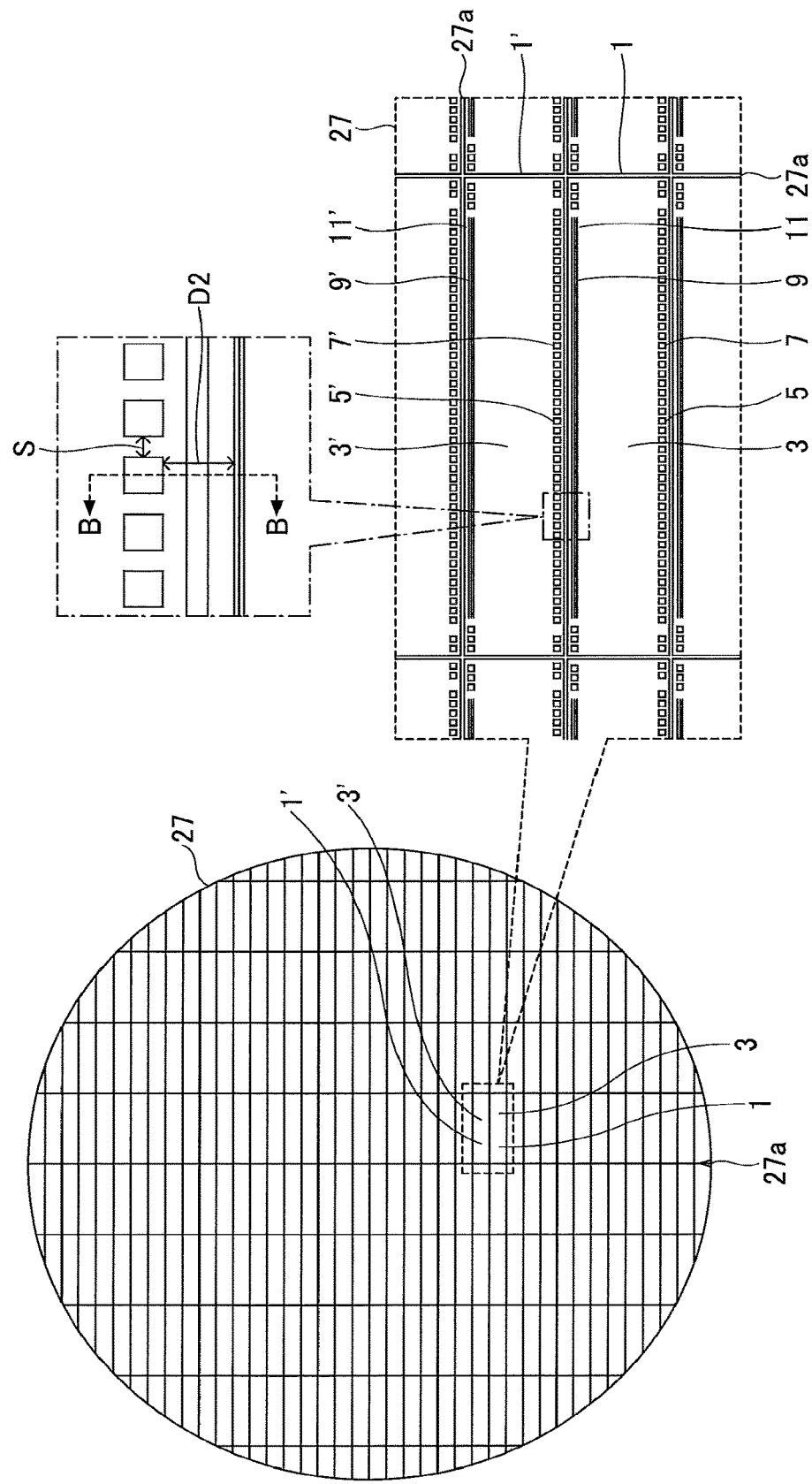
FIG. 4 is a view of one example of the solid-state imaging device in one or more embodiments, and illustrates a positional relationship between electrode pads and optical filters.
Figure 5:
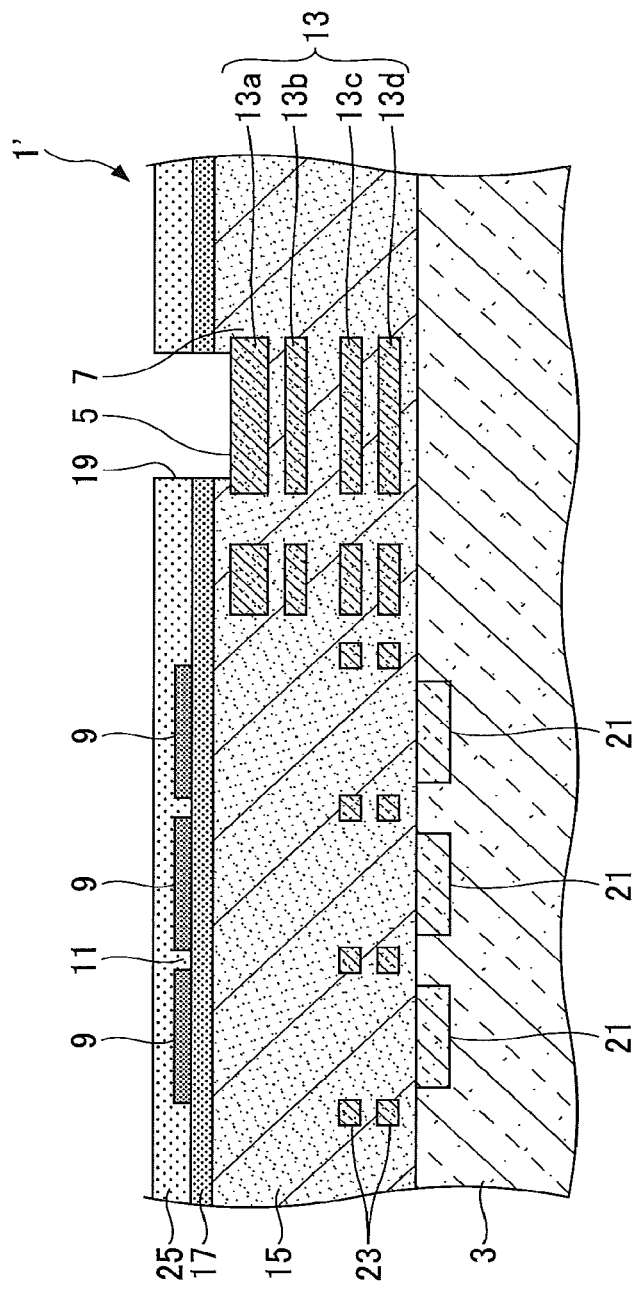
FIG. 5 is a cross-sectional view taken along the line B-B of FIG. 4.

Another example of a producing method of a solid-state imaging device in one or more embodiments will be described. FIG. 4 is a plan view of a positional relationship between a semiconductor substrate 27 and linear sensors 1 and 1' adjacent to each other. The semiconductor substrate 27 includes a plurality of substrates 3 and 3' that are provided on an identical plane. The linear sensors 1 and 1' are produced in the producing method in this example. FIG. 5 is a cross-sectional view taken along the line B-B of FIG. 4.

In this example, the linear sensors 1 and 1' are produced. The rectangular substrates 3 and 3' are arranged on an identical plane of the semiconductor substrate 27. In the linear sensors 1 and 1', the electrode pads 5 and 5', the photodiodes 21, and the color filters 9 and 9' are respectively arranged on the substrates 3 and 3'. In this example, the producing method includes a first process and a second process.

First, in the first process, the plurality of electrode pads 5 and 5' are respectively arranged at the first end portions in the width direction of the substrates 3 and 3' through the multilayer interconnections 13, so as to form the regions 7 and 7' that extend in the length direction of the substrates 3 and 3'. Here, the plurality of electrode pads 5 and 5' are arranged in the length direction. In the plurality of electrode pads 5 and 5', adjacent electrode pads are apart from each other by the space S.

Next, in the second process, as illustrated in FIG. 5, the photodiodes 21 are provided at the second end portions in the width direction of the substrates 3 and 3'. The color filters 9 and 9' are arranged at the second end portions in the width direction of the substrates 3 and 3' to respectively face the photodiodes 21 on a one-to-one basis, so as to form the regions 11 and 11' that extend in the length direction of the substrates 3 and 3'. At this timing, the region 11 of the substrate 3 is arranged to extend in parallel to the region 7' of the substrate 3', which is adjacent to the substrate 3. The region 11 is apart from the region 7' of the substrate 3' by a distance D2.

The color filters 9 and 9' are respectively arranged in the regions 11 and 11' of the substrates 3 and 3' and the plurality of electrode pads 5 and 5' are respectively arranged in the regions 7 and 7' of the substrates 3 and 3', so that the space S and the distance D2 satisfy S<=D2. It is to be noted that notches 27a are provided beforehand in the semiconductor substrate 27 in order to indicate the direction of a crystal axis. The semiconductor substrate 27 is divided along the notches 27a, and then a plurality of linear sensors 1 and 1' are enabled.

Figure 6:
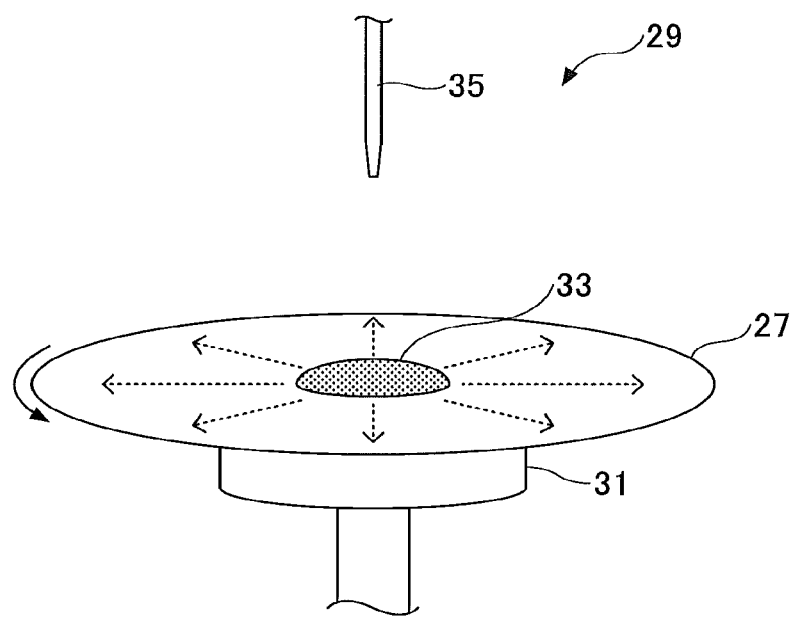
FIG. 6 is a schematic view of an apparatus used as one example of a producing method of the solid-state imaging device in one or more embodiments.

Here, in the second process, a method of applying a light-sensitive resin on the regions 11 and 11' of the substrates 3 and 3' to form the color filters 9 and 9' will be described. FIG. 6 is a schematic view of a spin coating apparatus. In the second process, the color filters 9 and 9' can be patterned by photolithography.

In forming the color filters 9 and 9', a light-sensitive resin containing a pigment or a dye is firstly applied onto the semiconductor substrate 27. The light-sensitive resin is applied in a film forming method named a spin coating method in a similar manner to forming of an interlayer insulating film or a photoresist used for patterning. A spin coating apparatus 29 as illustrated in FIG. 6 may be used for providing the color filters 9 and 9' in the spin coating method.

The spin coating apparatus 29 is configured such that the semiconductor substrate 27 is secured onto a supporting stand 31 that rotates at high speed, while the rotating speed and the time are being controlled. A light-sensitive resin 33 that constitutes materials of the color filters 9 and 9' is stored in a bottle, not illustrated, and is then supplied from the bottle. The light-sensitive resin 33 passes through a dropping pipe, not illustrated, and drops into the center portion of the semiconductor substrate 27 from a dropping nozzle 35. The light-sensitive resin 33 is spin coated by centrifugal force.

In order to eliminate or reduce unevenness caused by the rotation, the application conditions (e.g., rotating speed and time) of the spin coating apparatus 29 are controlled in consideration of the properties such as viscosity of the material resin to be controlled. After the light-sensitive resin 33 is applied in the spin coating method, exposure and development are conducted through a photomask having a masking pattern for necessary areas or unnecessary areas. The color filters 9 and 9' are arranged above the photodiodes 21.

As illustrated in FIG. 4, in one embodiment, the substrates 3 and 3' are arranged adjacent to each other in the width direction of the substrates 3 and 3' on the semiconductor substrate 27. The color filters 9 are arranged in the regions 11 in the substrate 3 and the electrode pads 5' are arranged in the region 7' in the substrate 3', such that the region 11 and the region 7' are arranged to extend in the length direction of the substrates 3 and 3' in parallel to each other and are apart from each other by the distance D2 in the width direction of the substrates 3 and 3'.

Figure 7:
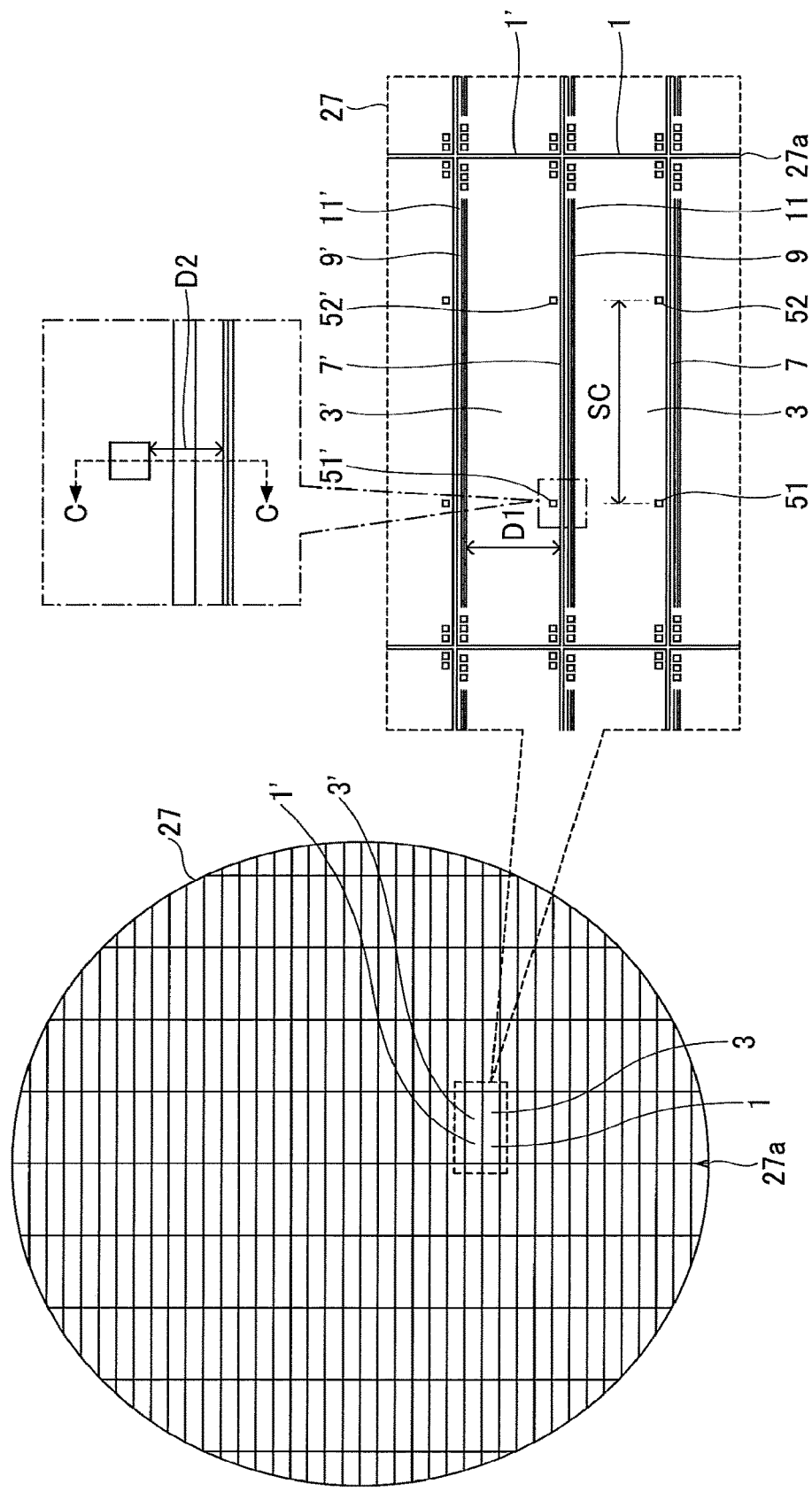
FIG. 7 is a view of a comparative example of the solid-state imaging device, and illustrates a positional relationship between electrode pads and optical filters.

In contrast, FIG. 7 is a view to be compared with the embodiment of FIG. 4. In one embodiment of FIG. 7, two electrode pads 51 and 52 are respectively arranged in the region 7, and two electrode pads 51' and 52' are arranged in region 7', in the substrates 3 and 3' adjacent to each other. It is to be noted that in FIG. 7, the other configurations are the same as the configurations in FIG. 4, except that the electrode pads 51 and 52 are arranged in the region 7 and the electrode pads 51' and 52' are arranged in the region 7'.

In one embodiment of FIG. 7, the electrode pads 51 and 52 are arranged in the region 7, and are apart from each other by a space SC in the length direction of the substrate 3. The electrode pads 51' and 52' are arranged in the region 7', and are apart from each other by the space SC in the length direction of the substrate 3. In addition, in one embodiment of FIG. 7, the region 11 and the region 7' extend in parallel to each other in the length direction, and are apart from each other by the distance D2. In the region 11, the color filters 9 are arranged on the substrate 3. In the region 7', the electrode pads 51' and 52' are arranged on the substrate 3', which is adjacent to the substrate 3 in the width direction.

The configuration of FIG. 4 is different from the configuration of FIG. 7 in number of electrode pads respectively arranged in the regions 7 and 7' of the substrates 3 and 3'. However, a cross-sectional view taken along the line C-C of FIG. 7 and the cross-sectional view of the line B-B of FIG. 4 indicate the same cross sections.

Figure 8A:
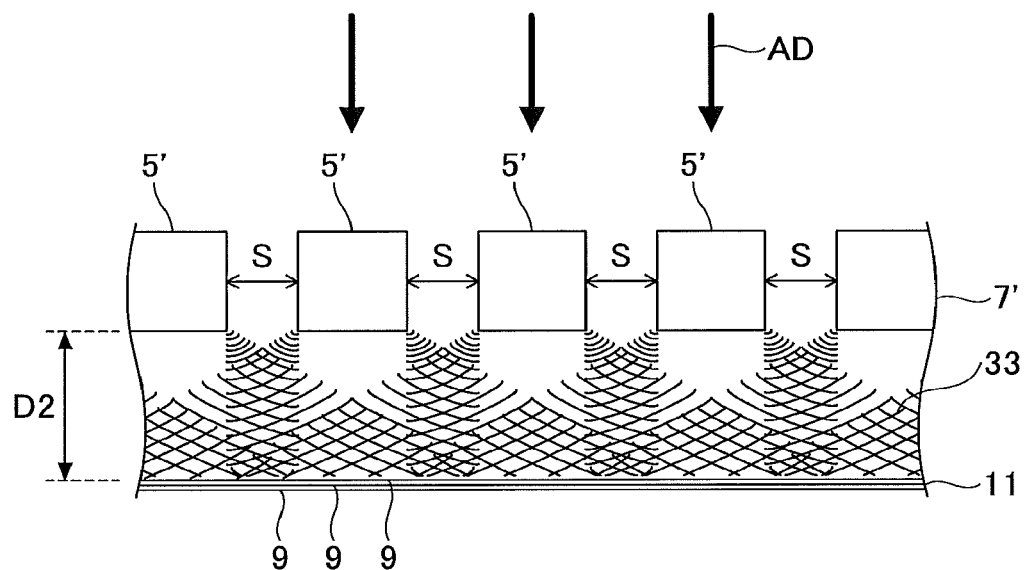
FIG. 8A is a view of forming the optical filters of FIG. 4.
Figure 8B:
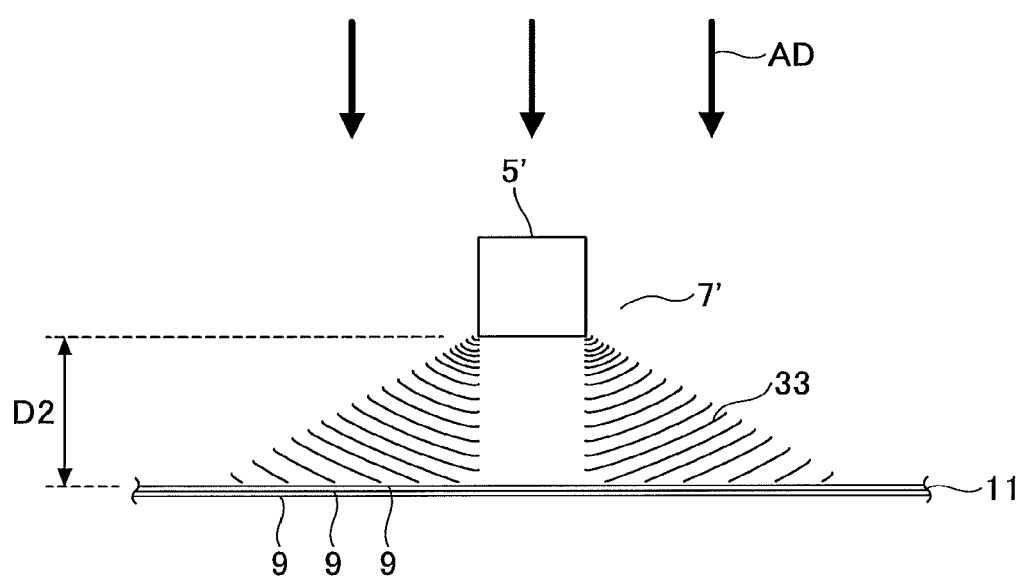
FIG. 8B is a view of forming the optical filters of FIG. 7.

FIG. 8A and FIG. 8B are views for comparing between the embodiments of FIG. 4 and FIG. 7 for effects brought about by the electrode pads 5' of the substrate 3' in the formation of the color filters 9 of the substrate 3. FIG. 8A illustrates the color filters in one embodiment as illustrated in FIG. 4. FIG. 8B illustrates the color filters in one embodiment as illustrated in FIG. 7. In both FIG. 8A and FIG. 8B, the region 11 of the substrate 3 and the region 7' of the substrate 3' are respectively arranged to be apart from each other by the distance D2 in the width direction of the adjacent substrates 3 and 3'. In both FIG. 8A and FIG. 8B, the photodiodes 21 are arranged below the color filters 9.

In FIG. 8A, however, four electrode pads 5' are arranged to be apart from each other by a specific space S in the region 7'. In FIG. 8B, only one electrode pad 5' is arranged. FIG. 8B is different from FIG. 8A in that, for example, none of the plurality of electrode pads 5 and 5' are arranged to be apart from each other by a specific space, or none of the plurality of electrode pads 5 and 5' are arranged at regular intervals.

In FIG. 8A and FIG. 8B, the light-sensitive resin 33 is applied in the direction of arrow AD. In FIG. 8A, the light-sensitive resin 33 passing between the electrode pads 5 and 5' is in mutual interference, and the color filters 9 are provided in a substantially uniform manner in the length direction of the region 11. In contrast, in FIG. 8B, the applied light-sensitive resin 33 becomes non-uniform near the electrode pad 5', consequently, unevenness is observed at the color filters 9.

As illustrated in FIG. 8B, the openings 19 and 19' of the electrode pads 5 and 5' are provided, and then the color filters 9 and 9' are applied in the spin coating method. This method results in the unevenness including non-uniformity or striation of the color filters 9 and 9' originating from stepped portions of the openings 19 and 19' of the electrode pads 5 and 5'.

In contrast, as illustrated in FIG. 8A, the plurality of electrode pads 5 and 5' are arranged at regular intervals. This configuration prevents generation of unevenness including non-uniformity or striation of the color filters 9 and 9' originating from stepped portions of the openings 19 and 19' of the electrode pads 5 and 5', even with the color filters 9 and 9' being applied in the spin coating method after the openings 19 and 19' of the electrode pads 5 and 5' are provided.

The depths in the stepped portions of the electrode pads 5 and 5' can reach, for example, approximately 500 nanometers. In the case of FIG. 7, the level difference near the electrode pads 5 and 5' is large, and thus may generate partially uneven surfaces.

In the case of the linear sensors as illustrated in FIG. 4 and FIG. 7, when an uneven color filter 9 affects only a single photodiode 21 arranged linearly in one dimension, such unevenness may distort the sensitivity or property of the photodiode 21. In the linear sensor 1, since the same photodiode 21 is used for reading images in a sub-scanning direction, longitudinal streaks in the sub-scanning direction may appear in a reading result.

Referring now to FIG. 9, in a case where the electrode pads 5 are irregularly arranged, dummy electrode pads 53 that do not function as the electrode pads are arranged together with the electrode pads 5 that do function as the electrode pads to be apart from each other by the space S in the region 7, as illustrated in FIG. 3. The provision of such dummy electrode pads 53 enables the dispersion of the localized unevenness that occurs when the electrode pads 5 are irregularly arranged or are not arranged at regular intervals, as illustrated in FIG. 8B.

Consequently, distortions in the image properties of the linear sensor are reduced, and the generation of longitudinal streaks in the sub-scanning direction is prevented. The dummy electrode pads 53 are arranged together with the electrode pads 5 at regular intervals, as described above. This configuration eliminates or reduces unevenness in the color filters 9, in which the unevenness is caused by the electrode pads 5 and 5' when the color filters 9 are applied in the spin coating method. It should be noted that the electrode pad 53 may be one example of a dummy electrode pad in one embodiment.

Figure 10:
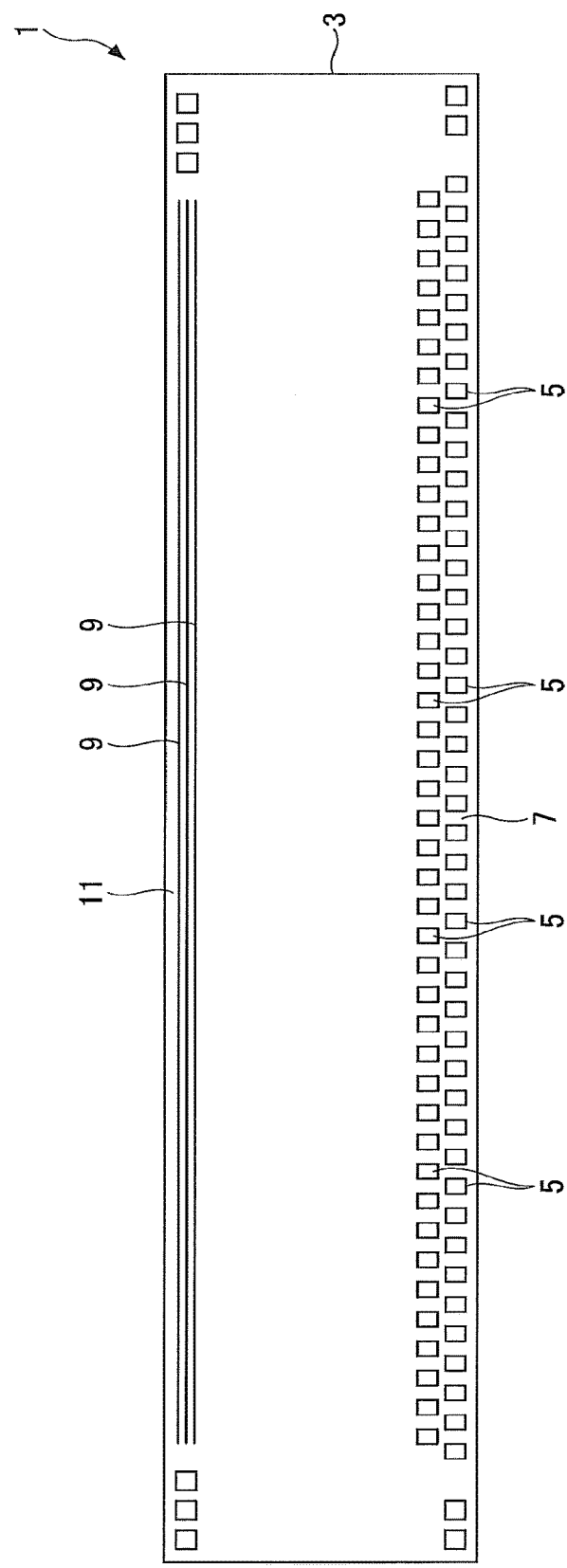
FIG. 10 is a view of one example of the solid-state imaging device in one or more embodiments.

Additionally, as illustrated in FIG. 10, the plurality of electrode pads 5 may have a staggered arrangement in the region 7. Such a staggered arrangement narrows spaces between the electrode pads, and thus forms the color filters with more uniformity. Additionally, as illustrated in FIG. 10, a plurality of lines of electrode pads are arranged in the length direction in the region 7. The number of arranged electrode pads is increased, accordingly. This configuration enables complex coupling between transistors and also various coupling types with the outside.

In applying the color filters in the spin coating method, it may be difficult to adjust the application direction depending on the condition of the spin coating apparatus or depending on the property of the resin. In such a case, the localized unevenness may occur and uniform color filters may not achievable by merely arranging the electrode pads 5 having the same size to be at regular intervals.

Figure 11:
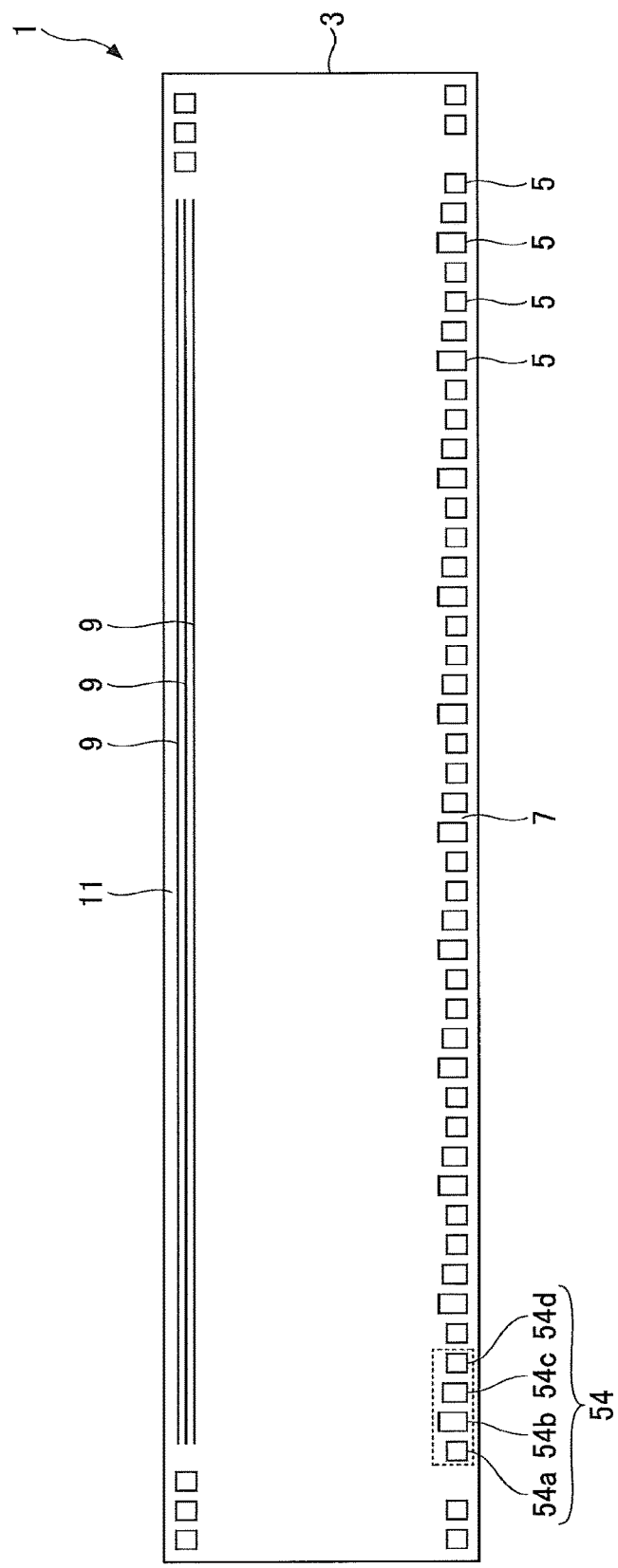
FIG. 11 is a view of one example of the solid-state imaging device in one or more embodiments.

Referring now to FIG. 11, a plurality of electrode pads 5 having different sizes may be arranged to be apart from each other by the specific space S. A pad group 54 including electrode pads 54a, 54b, 54c, and 54d is provided. Then, a plurality of pad groups 54 may be arranged to be apart from each other by the specific space S. The pad group 54 is one example of an electrode pad group in one embodiment.

The pad group 54 is configured as one group, as described above. In addition, a plurality of pad groups 54 are configured to be apart from each other by a specific space, which is the same as the space between the electrode pads within one group. This configuration prevents the occurrence of the localized unevenness in the color filters caused by the application direction of the resin at the time when the color filters are provided.

In FIG. 1, FIG. 9, FIG. 10, and FIG. 11, the electrode pads all have rectangular shapes. However, instead of the rectangular shapes, the electrode pads may have polygonal or circular shapes. By arranging electrode pads having polygonal or circular shapes, further dispersion against localized unevenness can be obtained.

In addition, the arrangements of the electrode pads as illustrated in FIG. 1, FIG. 9, FIG. 10, and FIG. 11 may be partially exchanged with each other. For example, in the electrode pads 5 as illustrated in FIG. 1, a first part of the electrode pads 5 may be configured to have a staggered arrangement as illustrated in FIG. 10, a second part may be arranged with the pad group 54 as illustrated in FIG. 11, and a third part may be arranged with the dummy electrode pads 53 as illustrated in FIG. 9.

In some long linear sensors, an internal circuit 37 including an ADC circuit 37a and a vertical/horizontal scan circuit 37b may be arranged. In supplying the internal circuit 37 with electricity, the electricity supplied only in the lateral direction needs thicker power supply interconnections to reduce voltage drops at the center portion of the internal circuit 37.

Figure 12:
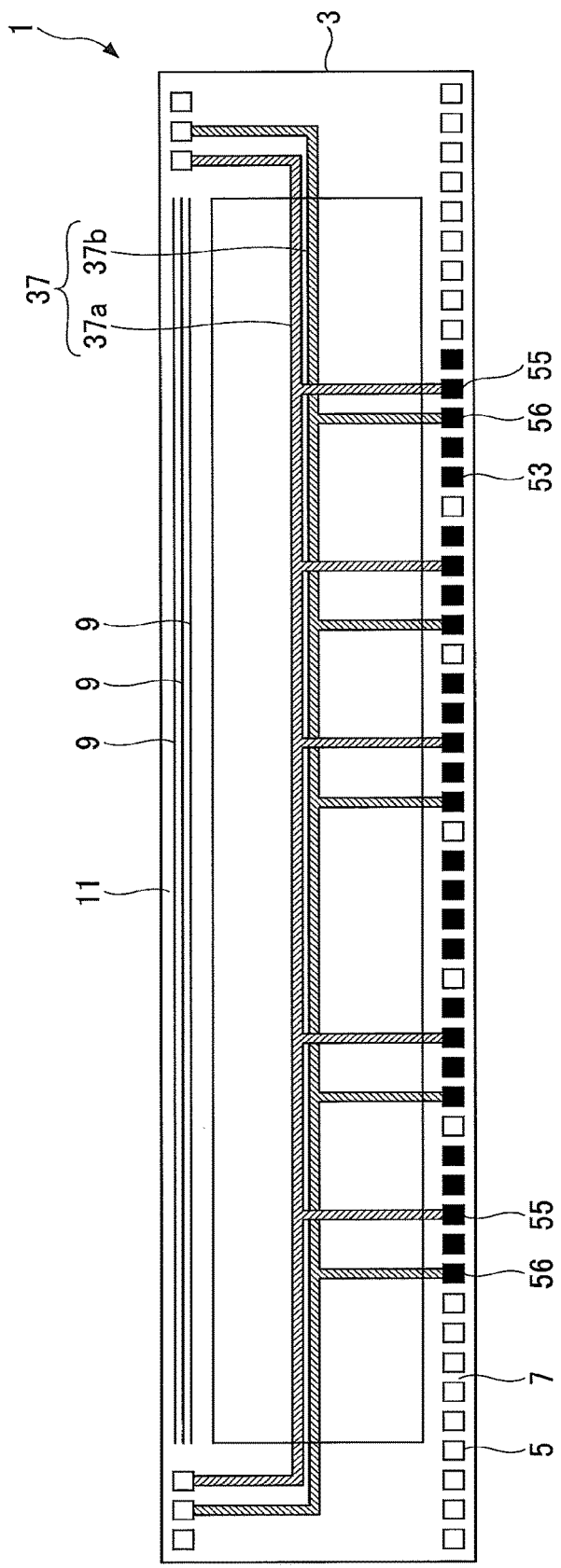
FIG. 12 is a view of one example of the solid-state imaging device in one or more embodiments.

Referring now to FIG. 12, some of the dummy electrode pads 53 may be used for power supply electrode pads 55 or as GND electrode pads 56. Specifically, as illustrated in FIG. 12, the power supply electrode pads 55 are coupled to the ADC circuit 37a. The GND electrode pads 56 are coupled to the vertical/horizontal scan circuit 37b.

As described above, the use of some of the dummy electrode pads 53 as the power supply electrode pads 55 or as the GND electrode pads 56 can reduce voltage drops and enable the use of thinner interconnections, instead of using thicker power supply interconnections to supply the power in the lateral direction. This configuration also achieves effective uses of the dummy electrode pads 53 by functioning as power supply electrode pads or as the GND electrode pads, as the dummy electrode pads 53 otherwise do not function as electrode pads.

The electrode pad 55 is one example of a power supply electrode pad in one embodiment. The electrode pad 56 is one example of a GND electrode pad.

Figure 13:
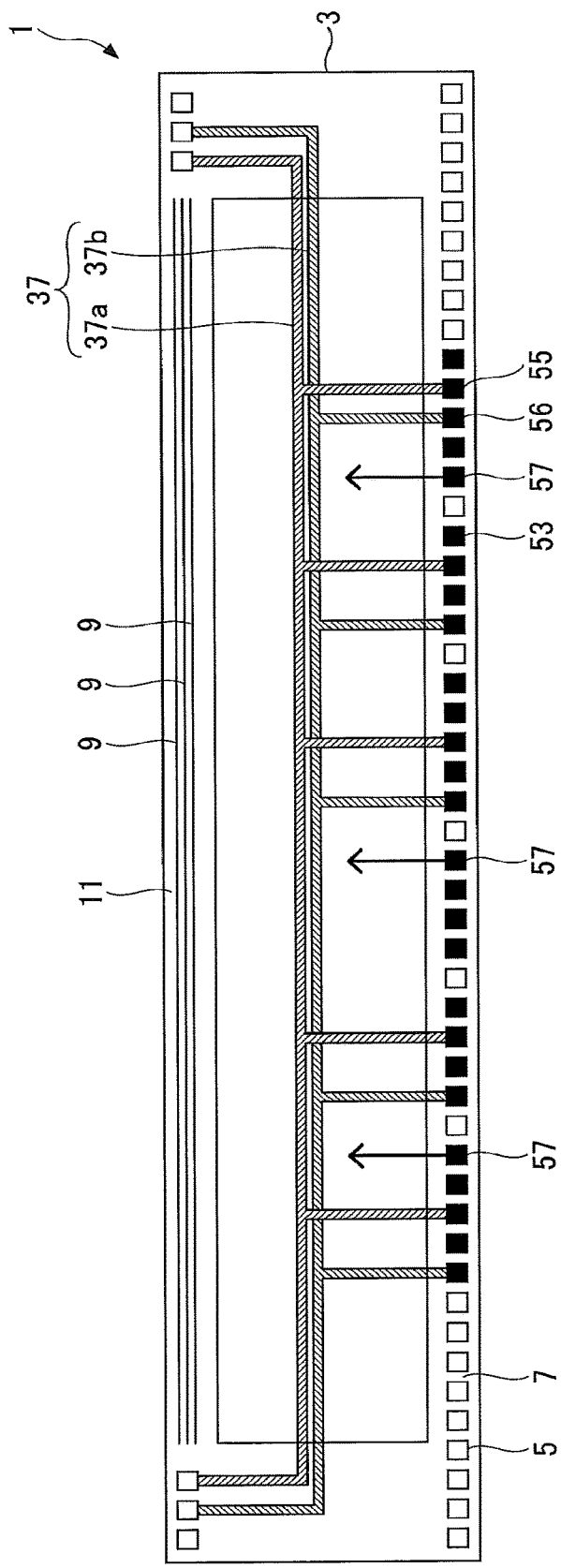
FIG. 13 is a view of one example of the solid-state imaging device in one or more embodiments.

To operate the internal circuit 37 at high speed, it is necessary to supply a high-speed clock from the lateral direction to pass through several stages of buffers. As illustrated in FIG. 13, some other parts of the dummy electrode pads 53 may be used for driving clock electrode pads 57 to supply high-speed clocks. In this case, the driving clock electrode pads 57 may be coupled to external wiring or in-package wiring, not illustrated.

The provision of the driving clock electrode pads 57 enables the supply of high-speed clocks to not need to pass through numerous stages of buffers. This configuration also achieves effective uses of the dummy electrode pads 53 by functioning as electrode pads for supplying the high-speed clocks, as the dummy electrode pads 53 otherwise do not function as the electrode pads. The electrode pad 57 is one example of a driving clock electrode pad in one embodiment.

With respect to the provision of the plurality of electrode pads 5, when the linear sensors are tested for shipment, probing may damage the electrode pads 5. The damaged electrode pads 5 may disturb the normal function of wire bonding that has been made in producing the linear sensors.

Figure 14:
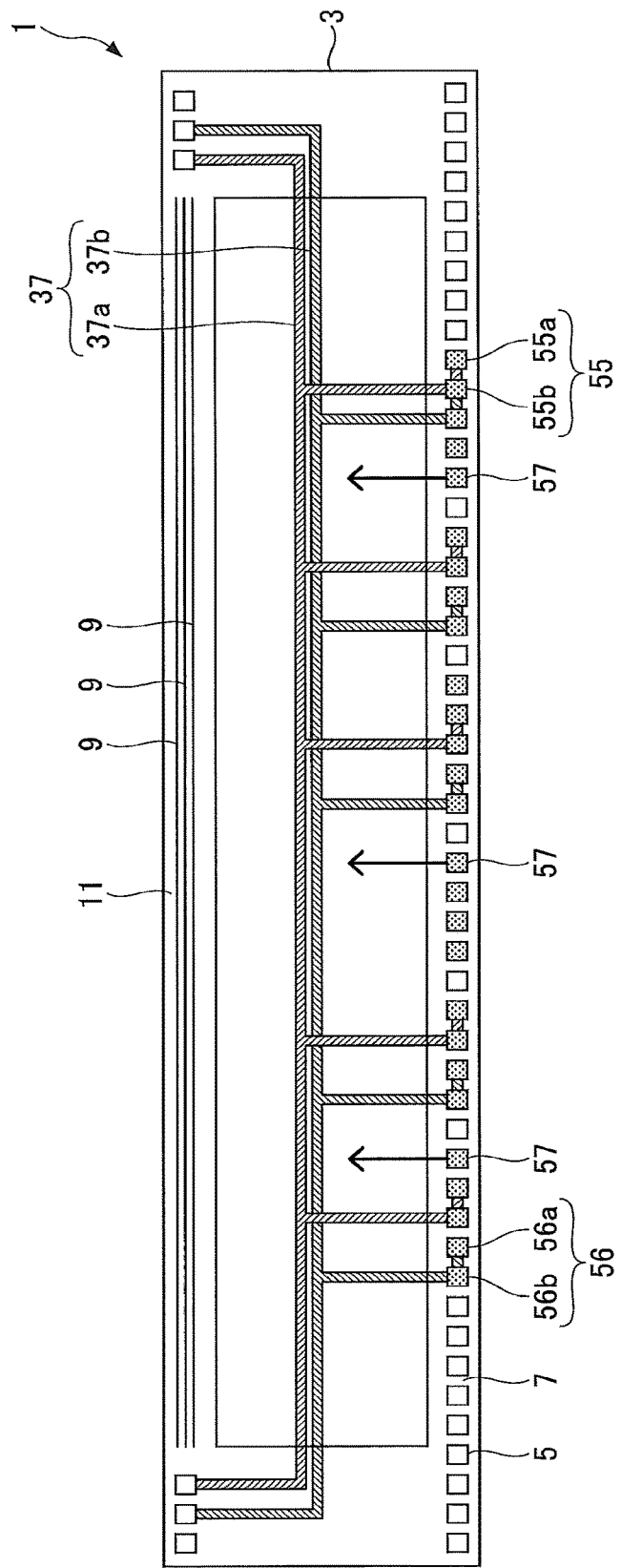
FIG. 14 is a view of one example of the solid-state imaging device in one or more embodiments.

Referring now to FIG. 14, first, some of the dummy electrode pads 53 may be arranged to become the power supply electrode pads 55 or the GND electrode pads 56. Then, with respect to the power supply electrode pads 55 and the GND electrode pads 56, probing electrode pads 55a and 56a may be assigned for probing the linear sensor 1 in the shipment test. The bonding electrode pads 55b and 56b may be assigned for mounting the linear sensor 1 on a package, for example.

As described above, the power supply electrode pads 55 and the GND electrode pads 56 may be assigned for the probing electrode pads and for the bonding electrode pads. This configuration prevents degradation in wire bonding properties due to probing of the linear sensor 1. The probing electrode pads 55a and 56a are examples of a test-use electrode pad in one embodiment. The bonding electrode pads 55b and 56b are examples of a mount-use electrode pad in one embodiment.

In FIG. 12 to FIG. 14, some of the dummy electrode pads 53 are used for forming the power supply electrode pads 55, the GND electrode pads 57, and the driving clock electrode pads 56. Such electrode pads may be used as a single type or may be used in combination.

Heretofore, one or more embodiments have been described in detail. However, the present disclosure is not limited to these embodiments, but various variations and modifications may be made without departing from the scope of the present invention. In particular, in one or more embodiments, a solid-state imaging device arranged in one dimension has been described as one example of the present disclosure. However, such a solid-state imaging device is applicable to a solid-state imaging device arranged in a matrix in two dimensions.

RELATED ART DOCUMENT

Patent Document

Patent Document 1: Japanese Unexamined Patent Application Publication No. 2011-171328

What is claimed is:

1. A solid-state imaging device comprising:
a substrate having a rectangular shape in a plan view, the rectangular shape having a length and a width less than the length;
a first region that extends on the substrate in a length direction of the substrate, and that includes a plurality of electrode pads arranged above the substrate through a multilayer interconnection, the plurality of electrode pads being arranged in a first line in the length direction of the substrate; and
a second region that extends in the length direction of the substrate, and that includes a plurality of imaging elements arranged in a second line in the length direction of the substrate, an optical filter, and an insulating film,
wherein the second region extends on the substrate on which the plurality of imaging elements are arranged,
wherein the optical filter is arranged above the substrate and faces the plurality of imaging elements through the insulating film,
wherein the second region extends in parallel to the first region and is apart from the first region by a given distance in a width direction perpendicular to the length direction,
wherein each of the plurality of electrode pads is arranged apart from one or more adjacent electrode pads of said plurality of electrode pads by a given space in the length direction of the substrate, the given space being equal to or smaller than the given distance,
wherein all of the plurality of electrode pads in the first line are adjacent to a first edge of a first long side of the substrate, and
wherein all of the plurality of imaging elements in the second line are adjacent to a second edge of a second long side of the substrate opposite the first long side of the substrate.

2. The solid-state imaging device according to claim 1, wherein at least one of the plurality of electrode pads is a dummy electrode pad.

3. The solid-state imaging device according to claim 1, wherein the plurality of electrode pads have a staggered arrangement in the plan view.

4. The solid-state imaging device according to claim 1,
wherein the plurality of electrode pads have different sizes, are included in a plurality of electrode pad groups, and are arranged to be apart from each other by the given space in each of the plurality of electrode pad groups, and
wherein the plurality of electrode pad groups are arranged to be apart from each other by the given space.

5. The solid-state imaging device according to claim 1, wherein at least one of the plurality of electrode pads has a polygonal shape in the plan view.

6. The solid-state imaging device according to claim 1, wherein at least one of the plurality of electrode pads is any one of a first electrode pad configured to receive electricity, a second pad configured to be grounded, and a third electrode pad configured to receive a driving clock.

7. The solid-state imaging device according to claim 6, wherein one of the first electrode pad and the second electrode pad is one of a test-use electrode pad and a mount-use electrode pad.

8. A method for producing a solid-state imaging device, the method comprising:
forming a first region extending on a substrate having a rectangular shape in a plan view, the rectangular shape having a length and a width less than the length, the first region extending on the substrate in a length direction of the substrate, the first region including a plurality of electrode pads arranged above the substrate through a multilayer interconnection, and the plurality of electrode pads being arranged in a first line in the length direction of the substrate; and
forming a second region extending in the length direction of the substrate, the second region including a plurality of imaging elements arranged in a second line in the length direction of the substrate, an optical filter, and an insulating film,
wherein the second region extends on the substrate on which the plurality of imaging elements are arranged,
wherein the optical filter is arranged above the substrate and faces the plurality of imaging elements through the insulating film,
wherein the second region extends in parallel to the first region and is apart from the first region by a given distance in a width direction perpendicular to the length direction,
wherein each of the plurality of electrode pads is arranged apart from one or more adjacent electrode pads of said plurality of electrode pads by a given space in the length direction of the substrate, the given space being equal to or smaller than the given distance,
wherein all of the plurality of electrode pads in the first line are adjacent to a first edge of a first long side of the substrate, and
wherein all of the plurality of imaging elements in the second line are adjacent to a second edge of a second long side of the substrate opposite the first long side of the substrate.

9. A method for producing a solid-state imaging device, the method comprising:
forming a first region on each of a plurality of substrate portions of a semiconductor substrate that extends in a length direction of each of the plurality of substrate portions, which are arranged on an identical plane, each of the plurality of substrate portions having a rectangular shape in a plan view, the rectangular shape having a length and a width less than the length, and each of the first regions including a plurality of electrode pads arranged above a corresponding substrate portion, of the plurality of substrate portions, through a multilayer interconnection, and being arranged in a first line in the length direction of the corresponding substrate; and
forming a second region on each of the plurality of substrate portions that extends in the length direction of each of the plurality of substrate portions arranged on the identical plane, each of the second regions including a plurality of imaging elements arranged in a second line in the length direction of the corresponding substrate portion, an optical filter, and an insulating film,
wherein, for each of the second regions:
the second region extends on each of the plurality of substrate portions on which the plurality of imaging elements are arranged,
the optical filter is arranged above the substrate portion and faces the plurality of imaging elements through the insulating film,
the second region extends in parallel to the first region,
the second region is apart from the first region formed in an adjacent substrate portion of the plurality of substrate portions by a given distance in a width direction perpendicular to the length direction, and
wherein the plurality of electrode pads are arranged to be apart from each other by a given space in the length direction of the corresponding substrate portion, the given space being equal to or smaller than the given distance.

10. The method for producing the solid-state imaging device according to claim 8, wherein the optical filter is provided in a spin coating method.

11. The method for producing the solid-state imaging device according to claim 9, wherein the optical filter is provided in a spin coating method.

12. The solid-state imaging device according to claim 1, further comprising another said substrate having the rectangular shape in the plan view, said another said substrate being arranged adjacent to said substrate in a same plane such that the first region of said substrate is adjacent to the second region of said another substrate in the width direction,
wherein the first region of said substrate is apart from the second region of said another substrate by a second given distance in the width direction that is greater than or equal to the given space associated with the electrode pads.

13. A solid-state imaging device comprising:
a substrate having a rectangular shape, the rectangular shape having a length and a width less than the length;
a first region that extends on the substrate in a length direction of the substrate, and that includes a plurality of electrode pads arranged above the substrate through a multilayer interconnection; the plurality of electrode pads being arranged in a first line in the length direction of the substrate; and
a second region that extends in the length direction of the substrate, and that includes a plurality of imaging elements arranged in a second line in the length direction of the substrate,
wherein the second region extends in parallel to the first region and is apart from the first region by a given distance in a width direction perpendicular to the length direction,
wherein each of the plurality of electrode pads is arranged apart from one or more adjacent electrode pads of said plurality of electrode pads by a given space in the length direction of the substrate, the given space being equal to or smaller than the given distance,
wherein all of the plurality of electrode pads in the first line are adjacent to a first edge of a first long side of the substrate, and
wherein all of the plurality of imaging elements in the second line are adjacent to a second edge of a second long side of the substrate opposite the first long side of the substrate.

14. The solid-state imaging device according to claim 13, wherein at least one of the plurality of electrode pads is a dummy electrode pad.

15. The solid-state imaging device according to claim 13, wherein the plurality of electrode pads have a staggered arrangement.

16. The solid-state imaging device according to claim 13, wherein the plurality of electrode pads have different sizes, are included in a plurality of electrode pad groups, and are arranged to be apart from each other by the given space in each of the plurality of electrode pad groups, and wherein the plurality of electrode pad groups are arranged to be apart from each other by the given space.

17. The solid-state imaging device according to claim 13, wherein at least one of the plurality of electrode pads has a polygonal shape in a plan view of the substrate.

18. A method of fabricating a solid-state imaging device, comprising:

defining a plurality of substrate portions on a wafer, each of the substrate portions having a first region and a second region, for each of the substrate portions:

the first region extends on the substrate portion in a length direction of the substrate portion and includes a plurality of electrode pads arranged in a first line in the length direction of the substrate portion, the second region extends on the substrate portion in the length direction of the substrate and includes a plurality of imaging elements arranged in a second line in the length direction of the substrate portion, the second region extends in parallel to the first region by a given distance in a width direction perpendicular to the length direction, the plurality of electrode pads is apart from each other by a given space in the length direction, and the given space is equal to or smaller than the given distance; and physically dividing the individual substrates plurality of substrate portions.

19. The method according to claim 18, wherein a first one of the substrate portions is arranged adjacent to a second one of the substrate portions in a same plane such that the first region of the first substrate portion is adjacent to the second region of the second substrate portion in the width direction, and wherein the first region of the first substrate portion is apart from the second region of the second substrate portion by a second given distance in the width direction that is greater than or equal to the given space associated with the electrode pads.

* * * * *